United States Patent [19]

Eriksson et al.

[11] Patent Number: 5,022,082
[45] Date of Patent: Jun. 4, 1991

[54] ACTIVE ACOUSTIC ATTENUATION SYSTEM WITH REDUCED CONVERGENCE TIME

[75] Inventors: Larry J. Eriksson, Madison; Mark C. Allie, Oregon, both of Wis.

[73] Assignee: Nelson Industries, Inc., Stoughton, Wis.

[21] Appl. No.: 464,337

[22] Filed: Jan. 12, 1990

[51] Int. Cl.$^5$ .......................................... G10K 11/16
[52] U.S. Cl. ..................................................... 381/71
[58] Field of Search .......................................... 381/71

[56] References Cited

U.S. PATENT DOCUMENTS

| | | | |
|---|---|---|---|
| 4,473,906 | 9/1984 | Wamaka et al. | 381/73.1 |
| 4,677,676 | 6/1987 | Eriksson | 381/71 |
| 4,677,677 | 6/1987 | Eriksson | 381/71 |
| 4,736,431 | 4/1988 | Allie et al. | 381/71 |
| 4,783,817 | 11/1988 | Hamada et al. | 381/71 |
| 4,815,139 | 3/1989 | Eriksson et al. | 381/71 |
| 4,837,834 | 6/1989 | Allie | 381/71 |

OTHER PUBLICATIONS

*Adaptive Signal Processing*, Bernard Widrow and Samuel D. Stearns, Prentice-Hall, 1985.

Primary Examiner—Jin F. Ng
Assistant Examiner—Sylvia Chen
Attorney, Agent, or Firm—Andrus, Sceales, Starke & Sawall

[57] ABSTRACT

A method is provided for reducing convergence time of an active acoustic attenuation system upon start-up or upon a given sensed parameter change. The weights of the adaptive filter model coefficient weight vector are started at or changed to values which are closer to the converged value than the initial or present nonconverged value is to the converged value. The filter model converges in a shorter time as the weights change and are updated from their starting or changed value to the converged value.

17 Claims, 2 Drawing Sheets

ACTIVE ACOUSTIC ATTENUATION SYSTEM WITH REDUCED CONVERGENCE TIME

BACKGROUND AND SUMMARY

The invention relates to active acoustic attentuation systems, and provides a system with reduced convergence time to provide faster cancellation of undesired noise.

The invention arose during continuing development efforts relating to the subject matter shown and described in U.S. Pat. Nos. 4,677,676, 4,677,677, 4,736,431, 4,815,139, 4,837,834, and Ser. No. 07/388,014 filed July 31, 1989, all assigned to the assignee of the present invention, and incorporated herein by reference.

Active attenuation involves injecting a cancelling acoustic wave to destructively interfere with and cancel an input acoustic wave. In an active acoustic attenuation system, the output acoustic wave is sensed with an error transducer such as a microphone which supplies an error signal to a control model which in turn supplies a correction signal to a cancelling transducer such as a loud speaker which injects an acoustic wave to destructively interfere with the input acoustic wave and cancel same such that the output acoustic wave or sound at the error microphone is zero or some other desired value. The acoustic system is modeled with an adaptive filter model having a model input from an input transducer such as a microphone, and an error input from the error microphone, and outputting the noted correction signal to the cancelling speaker. The adaptive filter model is characterized by a coefficient weight vector as is known in the art, Bernard Widrow and Samuel D. Stearns, *Adaptive Signal Processing*, Prentice-Hall, 1985. The error signal from the error microphone approaches a given value, such as zero, as the adaptive filter model responds to the error signal and input signal by updating the weights of the coefficient weight vector from an initial nonconverged value in a nonconverged condition of the filter model at turn-on thereof to a converged value in a converged condition of the filter model. The model continues to adapt to changes in the error signal and input signal.

At turn-on of the model, the vector weights typically start at zero. During the modeling and adaption process, the weights are updated, and eventually change to a final converged value. This final converged value will further change as the input acoustic wave to be cancelled changes.

In various applications, the convergence time of the model is not a significant factor. Typical convergence times may be tens of seconds, or even a minute or two. In applications involving noise from a large industrial fan, a factory, and the like, these convergence times are not objectionable. In other applications, however, faster convergence time may be desirable.

One application where faster convergence time is desirable is the quieting of a motor vehicle exhaust, where substantially instantaneous noise cancellation is preferred.

Another application where faster noise cancellation is desired is in the interior of a motor vehicle where the driver or passengers are exposed to noise introduced by the engine, exhaust system, tires, road, etc., where quick cancellation is desirable.

The present invention is particularly useful in combination with that in noted copending application Ser. No. 07/388,014. The noted copending application involves an intercom communication system with active acoustic attenuation. The noted noise within the vehicle is annoying and prevents enjoyment of the vehicle entertainment system and hinders communication with the vehicle via radio telephone. The present invention in combination with that in the noted copending application cancels the noise and quiets the environment quickly, and also enables enjoyment of the entertainment system and communication to the vehicle via radio telephone, and vice versa.

Another particularly desirable application of the present invention and that in the noted copending application is in magnetic resonance medical imaging systems where the patient is in a noisy environment in the hollow interior tunnel of a cylindrical tubular structure subject to magnetic hum and the like. The patient has difficulty hearing the attendant medical technician, and vice versa, and it is thus difficult to communicate instructions, symptoms, etc. Furthermore, the noise adds to the discomfort of the patient who may already be apprehensive of the medical procedure and the claustrophobic tunnel. The combination of the present invention and that in the noted copending application quickly cancels the noise and quiets the environment within the tunnel, and also enables communication from the patient to the medical technician, and vice versa.

The invention also reduces convergence time of the filter model to new convergence conditions in response to changes of the input acoustic wave. New updated weight values are provided according to a sensed parameter of the acoustic system without waiting for convergence of the filter model to the newly changed input acoustic wave, such that the filter model converges to the newly changed input signal in a shorter time. The invention thus provides reduced convergence time both at initial turn-on of the system and also after the system is up and running and converged and then subject to a new input condition. The latter is particularly useful in systems where the input noise may be subject to rapid and large magnitude changes where the channel gain must be changed and the model must reflect the gain change.

DETAILED DESCRIPTION

Figure 1:
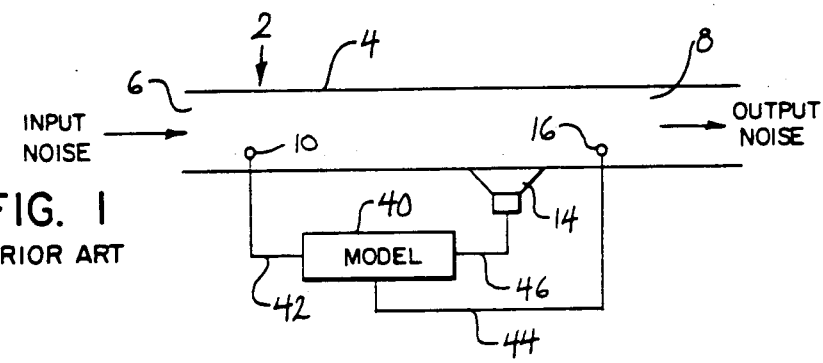
FIG. 1 shows an active acoustic attenuation system in accordance with the above noted incorporated patents.

FIG. 1 shows an active acoustic attenuation system in accordance with incorporated U.S. Pat. No. 4,677,676, FIG. 5, and like reference numerals are used from said patent where appropriate to facilitate understanding. The acoustic system 2 includes an axially extending duct 4 having an input 6 for receiving input noise and an output 8 for radiating or outputting output noise. The acoustic wave providing the noise propagates axially left to right through the duct. The duct may be an industrial fan exhaust duct, a factory, an exhaust pipe of a motor vehicle, the interior of the motor vehicle, the hollow interior tunnel of a magnetic resonance medical imaging system, or some other zone subject to undesirable sound waves in an elastic medium including liquid-filled pipes or vibrating structures.

The acoustic system is modeled with an adaptive filter model 40 having a model input 42 from input microphone or transducer 10, and an error input 44 from error microphone or transducer 16, and outputting a correction signal at 46 to omnidirectional output speaker or transducer 14 to introduce cancelling sound waves such that the error signal at 44 approaches a given value such as zero. The cancelling acoustic wave from output transducer 14 is introduced into duct 4 or such other appropriate zone for attenuating the output acoustic wave. Error transducer 16 senses the combined output acoustic wave and cancelling acoustic wave and provides an error signal at 44. The input acoustic wave is alternatively sensed with an input transducer such as a tachometer or the like which gives the frequency of a periodic input acoustic wave, such as from an engine or the like, without actually measuring or sensing such noise.

Figure 2:
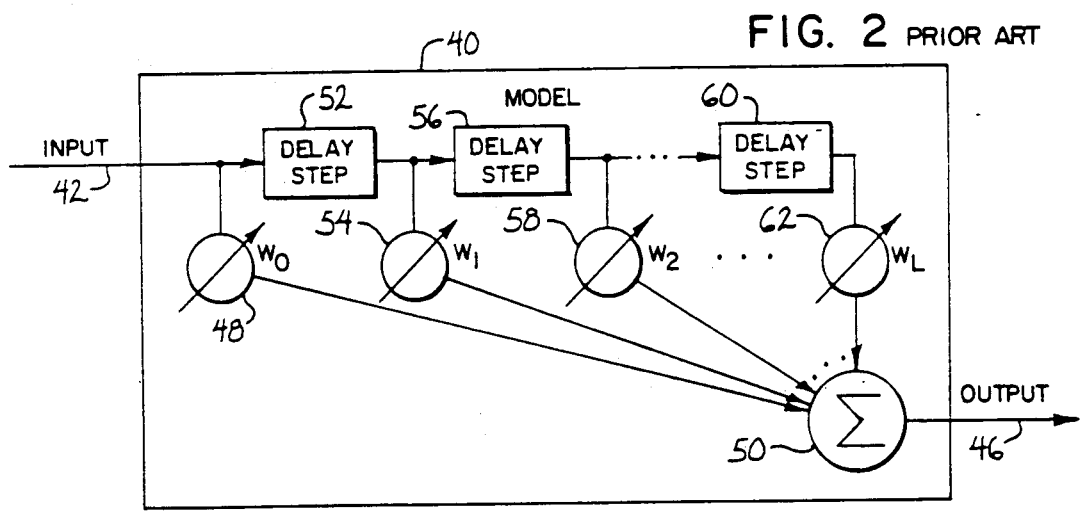
FIG. 2 illustrates the model of FIG. 1.

Error signal 44 approaches a given value such as zero as adaptive filter model 40 responds to error signal 44 and input signal 42 by updating the weights of the coefficient weight vector of the filter from an initial nonconverged value in a nonconverged condition of the filter model at turn-on thereof to a converged value in a converged condition of the filter model. FIG. 2 illustrates model 40 and is like FIG. 2.2 on page 17 of the above noted Widrow and Stearns reference. The input at 42 to the model is multiplied at multiplier 48 by a first weight $w_0$ to yield one of the inputs to summer 50. The input is delayed at first delay step 52 and multiplied at multiplier 54 by a second weight $w_1$, and the result is supplied as another input to summer 50. The input is further delayed by a second delay step 56 and multiplied at multiplier 58 by a third weight $w_2$, and the result is supplied as another input to summer 50. The input signal is further delayed by a given number of delay steps and multiplied by respective weights. The output of the last delay step 60 is multiplied at multiplier 62 by weight $w_L$ and supplied as an input to summer 50. The summation of the inputs to summer 50 provides model output 46. This is shown in equation 1 below, which is equation 2.3 on page 17 of Widrow and Sterns.

$$\begin{aligned} \text{output} = \ &w_0 \cdot (\text{input}) + \\ &w_1 \cdot (\text{input one time step back}) + \\ &w_2 \cdot (\text{input two time steps back}) + \\ &\vdots \\ &w_L \cdot (\text{input } L \text{ time steps back}) \end{aligned}$$ (equation 1)

The output at 46 is equal to weight $w_0$ multiplied by the input at 42 plus the weight $w_1$ multiplied by the input one step back plus the weight $w_2$ multiplied by the input two steps back plus ... the weight $w_L$ multiplied by the input L steps back. Each delay or time step 52, 56 ... 60 is equal to the sampling period of the sampling frequency. The coefficient weight vector W is expressed in terms of the weights w as shown in equation 2 below, which is equation 2.5 on page 17 of Widrow and Stearns.

$$W = w_0, w_1, w_2 \ldots w_L \qquad \text{(equation 2)}$$

The weights are updated every sampling period to produce a new coefficient weight vector W. At any discrete time step or cycle, k, the coefficient weight vector is $W_k$, and one cycle later it is $W_{k+1}$, etc Considering a simple example, assume that the coefficient weight vector W has only two weights $w_0$, $w_1$, as shown in equation 3 below.

$$W = w_0, w_1 \qquad \text{(equation 3)}$$

Figure 3:
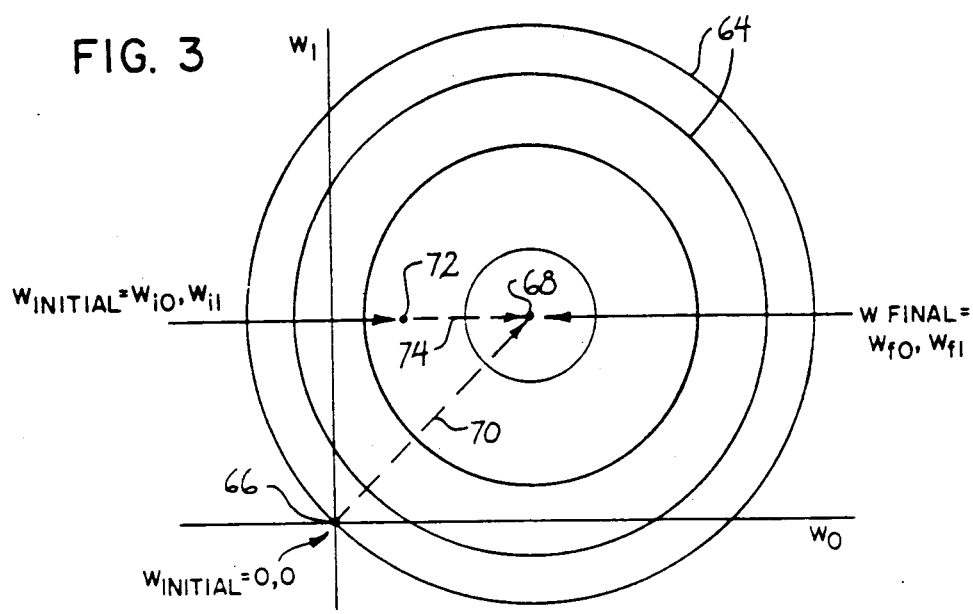
FIG. 3 illustrates a two weight error surface where a gradient search is performed by the method of steepest descent.

The adaptive filter algorithm of the model updates the weights w in such a way as to minimize the error signal. FIG. 3 illustrates a two weight or coefficient error surface like FIG. 4.7 on page 57 of Widrow and Stearns, where a gradient search is performed by the method of steepest descent. Weights $w_0$ and $w_1$ are shown along respective horizontal and vertical axes. The constant mean squared error contours are shown at the rings such as 64. The initial coefficient weight vector $W_{initial}$ typically has initial or starting weights w of 0, 0, as shown at point 66, and in equation 4 below.

$$W_{initial} = 0, 0 \qquad \text{(equation 4)}$$

As the filter model converges, the weights w are updated and change to their final value $w_{f0}$, $w_{f1}$, as shown at point 68, and in equation 5 below.

$$W_{final} = w_{f0}, w_{f1} \qquad \text{(equation 5)}$$

The adaption path is shown at 70.

Figure 4:
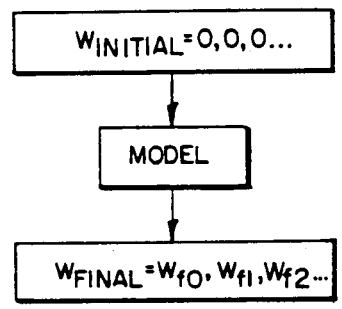
FIG. 4 shows prior art weight updating.

The general case is illustrated in FIG. 4 where the initial weights w of 0, 0, 0 ... of the initial coefficient weight vector $W_{initial}$ are updated and change to their final value $w_{f0}$, $w_{f1}$, $w_{f2}$ ... of the final coefficient weight vector $W_{final}$ as the filter model converges. The length of convergence time is typically tens of seconds, or perhaps even a minute or two. The model does not stay fixed at the final weights, but rather continues to adapt to changes in the error signal and input signal, resulting in further changes and continuing updates of the final weights. Final weights $w_{f0}$, $w_{f1}$, $w_{f2}$ ... of the final coefficient weight vector $W_{final}$ are thus temporary, and the model is not fixed but instead continues to adapt. The noted convergence times are thus from the initial weights 0, 0, 0 ... to the temporary final weights $w_{f0}$, $w_{f1}$, $w_{f2}$ .... The active acoustic attenuation system described thus far is known in the prior art.

Convergence time of the filter model at turn-on is reduced by starting the weights at values which are closer to the convergence value than the initial non-convergence value, $W_{initial}$ equals 0, 0, 0 ... is to the convergence value. In the example in FIG. 3, the initial coefficient weight vector $W_{initial}$ is started at initial weights $w_{i0}$, $w_{i1}$, as shown at point 72, and in equation 6 below.

$$W_{initial} = w_{i0}, w_{i1} \qquad \text{(equation 6)}$$

Point 72 is closer to point 68 than point 66 is to point 68, and hence adaption path 74 is shorter than adaption path 70. The filter model thus converges in a shorter time as the weights w change and are updated from the starting value $w_{i0}$, $w_{i1}$ to the convergence value $w_{f0}$, $w_{fi}$. This is illustrated for the general case in FIG. 5 where the initial weights $w_{i0}$, $w_{i1}$, $w_{i2}$ ... of the initial coefficient weight vector $W_{initial}$ are updated in a shorter time to the final weights $w_{f0}$, $w_{f1}$, $w_{f2}$ of the final coefficient weight vector $W_{final}$ as the model converges.

The noted starting weight values $w_{i0}$, $w_{i1}$, $w_{i2}$ ... of the initial coefficient weight vector $W_{initial}$ may be determined in various ways. In implementations involving large numbers of repeat applications, such as automobile exhaust silencing on the same type and model of car, the starting weight values can be preprogrammed at values very close to the final weight values because the manufacturing process and assembly of the exhaust system involves repetitive high volume items which will likely have only a small window of deviation. It is important to note that an adaptive filter is still required because the initial weight values cannot be determined on a practical basis with enough accuracy to obtain adequate noise cancellation. In addition, system changes must be adapted to on a continuous basis to maintain cancellation.

In contrast to the above noted repetitive automotive application, a large industrial factory noise or fan silencing implementation is usually a one-time custom job. In the latter type application, it is more practical to just start the weights at zero and let the model update the weights as it converges.

Figure 6:
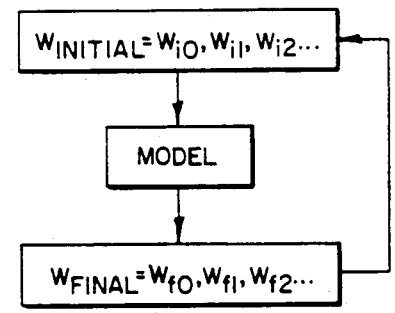
FIG. 6 shows an alternate version of weight updating.

The starting value of the weights may also be selected according to the converged value of the weights of the previous modeling of the acoustic system by the adaptive filter model, FIG. 6. The final weights $w_{f0}$, $w_{f1}$, $w_{f2}$ ... of the final coefficient weight vector $W_{final}$ are used as the initial weights $w_{i0}$, $w_{i1}$, $w_{i2}$ ... of the initial coefficient weight vector $W_{initial}$ for the next modeling at the next turn-on of the model, or to update such initial weights for the next modeling.

Figure 7:
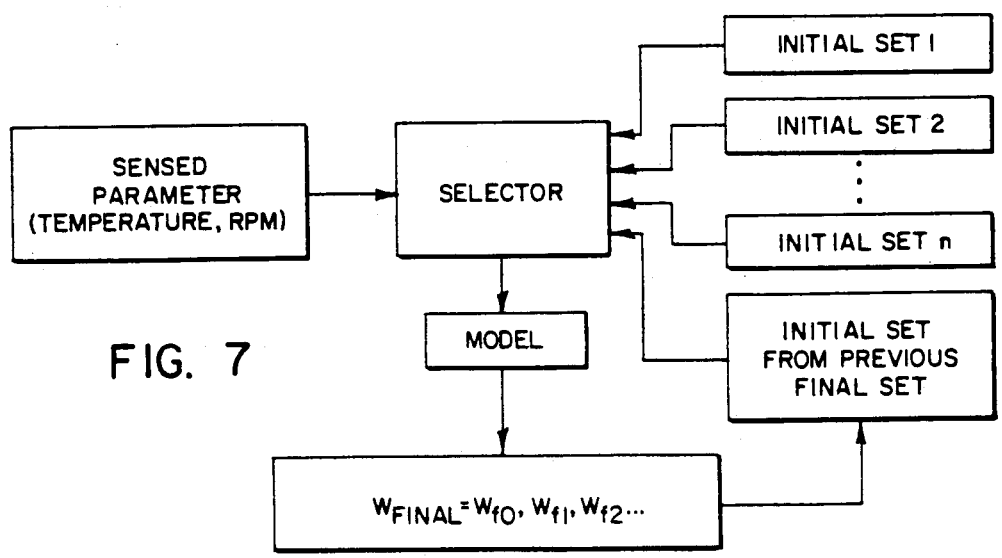
FIG. 7 shows a further alternate version of weight updating.

In another alternative, a plurality of initial sets 1, 2 ... n of predetermined starting values of weights are provided, FIG. 7, and one of the sets is selected according to a sensed parameter such as temperature, rpm, or ranges of combined sensed parameter values. The chosen initial set provides the starting values of the initial weights. The selector in FIG. 7 may also choose the initial set provided by the weights from the previous final set, i.e. the convergence value of the weights of the previous modeling, as in FIG. 6.

Figure 5:
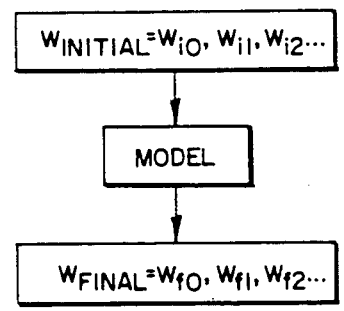
FIG. 5 shows weight updating in accordance with the present invention.

The method in FIG. 5 is useful if the starting values of the weights can be based on known filter model and transducer responses and distances. The method in FIG. 6 is useful in a wide variety of applications, including large industrial applications, or one-time applications. The method in FIG. 7 also has broad application because it emcompasses the features of the method of FIG. 6 and also enables special starting values of weights to be selected under specific conditions.

FIG. 7 further has particular application in automotive use for silencing engine exhaust where, for example, a downshift for rapid acceleration may be sensed which in turn selects a special set of weights which are immediately provided as the latest updated weight values without waiting for the model to otherwise converge to the new engine condition. The model thus converges faster to the new engine condition and reaches new final weights in less time.

The last noted application in FIG. 7 has further use in various systems subject to rapid changes in the input noise after initial turn-on of the system and after the system has converged. As noted above, the adaptive filter model responds to the error signal and input signal by updating the weights of the coefficient weight vector from an initial nonconverged value in a nonconverged condition of the filter model at turn-on thereof to a converged value in a converged condition of the filter model. The filter model continues to adapt to changes in the error signal and input signal such that the weights are further updated during such further convergence of the model to a new convergence value. Convergence time of the filter model to the new converged condition, in response to changes of the input acoustic wave, is reduced by providing new updated weight values according to a sensed parameter of the acoustic system such that the filter model converges to the newly changed input signal in a shorter time. A plurality of sets of predetermined values of weights may be provided, and one of the sets is selected according to given ranges of sensed parameter values without waiting for the filter model to otherwise adapt to the newly changed input signal in response to the newly changed input acoustic wave. Thus, for example, in the case of an automotive downshift for rapid acceleration, a special set of predetermined weight values is selected for immediate updating of the model, without waiting for the model to otherwise converge to the new conditions. In this manner, convergence time of the model is reduced not only at initial turn-on, but also after the model is converged and subsequently subject to rapid or dramatic changes in the input noise.

FIG. 2 shows a finite impulse response (FIR) filter, as in FIG. 2.2 on page 17 of Widrow and Stearns, for simplicity of illustration. Other filter models may be used. In applications where feedback noise is a concern, it is preferred that model 40 be that shown in the above incorporated patents, including the use of an infinite impulse response (IIR) filter, as shown in FIG. 7.2 on page 121 of Widrow and Stearns. In the above incorporated patents, the adaptive filter model has a transfer function with both poles and zeros, preferably provided by a recursive least mean square filter, to model the feedback path from speaker 14 to input microphone 10 with a single model. Finite impulse response (FIR) filters are not adequate to adaptively cancel direct and feedback noise. Instead, a single infinite impulse response (IIR) filter is needed to provide adaptive cancellation of the direct noise and acoustic feedback. In accordance with incorporated U.S. Pat. No. 4,677,676, the direct and feedback noise are modeled on-line with an adaptive recursive filter model, without separate on-line modeling of the direct noise and off-line modeling of the feedback path and pretraining a separate dedicated feedback filter. Instead, a single recursive model is used providing the IIR characteristic present in the acoustic feedback loop wherein an impulse will continually feed upon itself in feedback manner to provide an infinite response. Model 40 adapts for feedback on-line while the system is running, without pretraining. Model 40 adaptively models the acoustic path on-line without dedicated off-line pretraining, and also adaptively models the feedback path from the output transducer to the input transducer for both broadband and narrowband noise without dedicated off-line pretraining and without a separate model dedicated solely to the feedback path and pretrained thereto. It is also preferred that the auxiliary noise source 140 of incorporated U.S. Pat. No. 4,677,676 be used together with the improvements therein, and also with the improvements in incorporated U.S. Pat. Nos. 4,736,431, 4,815,139, and 4,837,834.

The auxiliary noise source introduces auxiliary noise into the adaptive filter model which is random and uncorrelated with the input acoustic wave.

It is recognized that various equivalents, alternatives and modifications are possible within the scope of the appended claims. The invention is applicable to sound waves, including noise and vibration, in gas, liquid or solid mediums.

We claim:

1. In an acoustic system having an input for receiving an input acoustic wave produced by an acoustic source, and an output for radiating an output acoustic wave, an active attenuation method for attenuating undesirable said output acoustic wave by introducing a cancelling acoustic wave from an output transducer, comprising:

sensing said input acoustic wave with an input transducer and providing an input signal;

sensing the combined said output acoustic wave and said cancelling acoustic wave from said output transducer with an error transducer and providing an error signal;

modeling said acoustic system with an adaptive filter model having a model input from said input transducer and an error input from said error transducer and outputting a correction signal to said output transducer to introduce the cancelling acoustic wave such that said error signal approaches a given value as said adaptive filter model responds to said input signal by updating weights of a coefficient weight vector from an initial nonconverged value in a nonconverged condition of said filter model at turn-on thereof to a converged value in a converged condition of said filter model;

reducing convergence time of said filter model at turn-on thereof by starting said weights at a starting value which is closer to said converged value than said initial nonconverged value is to said converged value, said filter model converging to said input signal in a shorter time as said weights change and are updated from said starting value to said converged value;

selecting said starting value according to a characteristic of said acoustic source.

2. The invention according to claim 1 comprising modeling said acoustic system with an adaptive filter model having a transfer function with both poles and zeros.

3. The invention according to claim 2 comprising modeling said acoustic system with an adaptive recursive filter model.

4. The invention according to claim 3 comprising modeling said acoustic system with a recursive least mean square filter model.

5. The invention according to claim 4 comprising adaptively modeling said acoustic path on-line with said adaptive filter model without dedicated off-line pretraining, and also adaptively modeling the feedback path from said output transducer to said input transducer for both broadband and narrowband noise without dedicated off-line pretraining and without a separate model dedicated solely to said feedback path and pretrained thereto.

6. The invention according to claim 1 comprising providing an auxiliary noise source and introducing auxiliary noise from said auxiliary noise source into said adaptive filter model, such that said error transducer also senses the auxiliary noise from said auxiliary noise source, said auxiliary noise being random and uncorrelated with said input acoustic wave.

7. The invention according to claim 1 comprising predetermining said starting value of said weights according to one or more sensed parameters of said acoustic source.

8. The invention according to claim 7 comprising providing a plurality of sets of predetermined starting values of said weights and selecting one of said sets according to given ranges of sensed parameter values.

9. The invention according to claim 8 wherein one of said sets is from the converged value of said weights of the previous modeling of said acoustic system by said adaptive filter model.

10. In an acoustic system having an input for receiving an input acoustic wave produced by an acoustic source, and an output for radiating an output acoustic wave, an active attenuation method for attenuating undesirable said output acoustic wave by introducing a cancelling acoustic wave from an output transducer, comprising:

sensing said input acoustic wave with an input transducer and providing an input signal;

sensing the combined said output acoustic wave and said cancelling acoustic wave from said output transducer with an error transducer and providing an error signal;

modeling said acoustic system with an adaptive filter model having a model input from said input transducer and an error input from said error transducer and outputting a correction signal to said output transducer to introduce the cancelling acoustic wave such that said error signal approaches a given value as said adaptive filter model responds to said input signal by updating weights of a coefficient weight vector from an initial nonconverged value in a nonconverged condition of said filter model at turn-on thereof to a converged value in a converged condition of said filter model, said filter model also responding to said input signal as the latter changes in response to changes of said input acoustic wave such that said weights are further updated during further convergence of said model to a new converged value;

reducing convergence time of said filter model to a new converged condition in response to changes of said input acoustic wave, by providing new updated weight values according to a sensed parameter of said acoustic source without waiting for convergence of said filter model, such that said filter model converges in a shorter time.

11. The invention according to claim 10 comprising providing a plurality of sets of predetermined values of weights, and selecting one of said sets according to given ranges of sensed parameter values, without waiting for said filter model to otherwise converge in response to the newly changed input acoustic wave.

12. The invention according to claim 10 comprising also reducing convergence time of said filter model at turn-on thereof by starting said weights at a starting value which is closer to said converged value than said initial nonconverged value is to said converged value, said filter model converging in a shorter time at turn-on as said weights change and are updated from said starting value to said converged value.

13. The invention according to claim 10 comprising modeling said acoustic system with an adaptive filter model having a transfer function with both poles and zeros.

14. The invention according to claim 13 comprising modeling said acoustic system with an adaptive recursive filter model.

15. The invention according to claim 14 comprising modeling said acoustic system with a recursive least mean square filter model.

16. The invention according to claim 15 comprising adaptively modeling said acoustic path on-line with said adaptive filter model without dedicated off-line pretraining, and also adaptively modeling the feedback path from said output transducer to said input transducer for both broadband and narrowband noise without dedicated off-line pretraining and without a separate model dedicated solely to said feedback path and pretrained thereto.

17. The invention according to claim 10 comprising providing an auxiliary noise source and introducing auxiliary noise from said auxiliary noise source into said adaptive filter model, such that said error transducer also senses the auxiliary noise from said auxiliary noise source, said auxiliary noise being random and uncorrelated with said input acoustic wave.

* * * * *